United States Patent [19] [11] 4,349,794
Kagiwada et al. [45] Sep. 14, 1982

[54] SHALLOW BULK ACOUSTIC WAVE DEVICES

[75] Inventors: Reynold S. Kagiwada, Los Angeles; Kuo-Hsiung Yen, Manhattan Beach; Ke-Li Wang; Kei F. Lau, both of Harbor City; Donald L. Lochhead, Rancho Palos Verdes; James A. Leaverton, Huntington Beach, all of Calif.

[73] Assignee: TRW Inc., Redondo Beach, Calif.

[21] Appl. No.: 954,149

[22] Filed: Oct. 24, 1978

Related U.S. Application Data

[63] Continuation-in-part of Ser. No. 861,133, Dec. 16, 1977, abandoned.

[51] Int. Cl.$^3$ .................. H03H 9/15; H03H 9/36; H03B 5/32
[52] U.S. Cl. .................. 333/141; 331/107 A; 333/143; 333/147; 333/155; 333/195
[58] Field of Search .................. 333/150–155, 333/193–196, 187–189, 141, 142–145, 147; 310/313, 313 R, 313 A, 313 B, 313 C, 313 D; 331/107 A; 330/5.5

[56] References Cited

U.S. PATENT DOCUMENTS

| | | | |
|---|---|---|---|
| 3,568,102 | 3/1971 | Tseng | 333/153 |
| 3,786,373 | 1/1974 | Schulz et al. | 333/155 |
| 3,805,189 | 4/1974 | Zucker et al. | 331/107 A |
| 3,836,876 | 9/1974 | Marshall et al. | 333/151 X |
| 3,855,548 | 12/1974 | Nandi et al. | 331/107 A |
| 3,859,608 | 1/1975 | Hartmann et al. | 333/195 |
| 3,868,595 | 2/1975 | Capps, Jr. et al. | 333/193 X |
| 3,950,713 | 4/1976 | Lewis | 331/107 A |
| 3,978,437 | 8/1976 | Paige | 333/195 |
| 3,999,147 | 12/1976 | Otto et al. | 333/155 X |
| 4,075,582 | 2/1978 | Walker | 333/196 |
| 4,078,210 | 3/1978 | Lewis | 333/196 X |
| 4,079,342 | 3/1978 | Solie | 333/196 X |
| 4,114,119 | 9/1978 | Sandy et al. | 333/195 |

OTHER PUBLICATIONS

Mason–"Physical Acoustics, Principles and Methods", Academic Press, New York, 1964; Title Page and pp. 371–376.
Marshall et al.–"New Unidirectional Transducer and Broadband Reflector of Acoustic Surface Waves", Electronics Letters, Sep. 30, 1971; pp. 638–640.
Milsom et al.–"Generation of Bleustein-Gulyaev and Bulk-Shear Waves by Interdigital Transducers on a Piezoelectric Ceramic", Electronic Letters, Sep. 6, 1973.
Reilly et al.–"Generation of Rayleigh and Bulk Waves by Interdigital Transducers on Y-Cut Z-Propagating Lithium Niobate", Electronics Letters, Sep. 6, 1973.
Mitchell–"Spurious Bulk Wave Signals in Acoustic Surface Wave Devices", 1974 Ultrasonics Symposium Proc., IEEE Cat. #74CHO896-ISU; pp. 313–320.
Browning et al.–"New Family of Bulk Acoustic Wave Devices Employing Interdigital Transducers", Electronics Letters, Mar. 3, 1977; pp. 128–130.
Yen et al.–"Efficient Bulk Wave Excitation on ST Quartz", Electronics Letters, Jan. 20, 1977; pp. 37–38.
Lau et al.–"Further Investigation of Shallow Bulk Acoustic Waves Generated by Using Interdigital Transducers", 1977 Ultrasonics Symposium Proc., IEEE Cat. #77CH1264-ISU; pp. 996–1001.
Browning et al.–"Bandpass Filters Employing Surface Skimming Bulk Waves", 1977 Ultrasonics Symposium Proc., IEEE Cat. #77CHI1264-ISU, pp. 753–756.
Browning et al.–"A New Class of Quartz Crystal Oscillator Controlled by Surface-Skimming Bulk Waves", Proc. of the 31st Annual Symposium on Frequency Control, U.S. AERDC; pp. 258–265, Jun. 1, 1977.
Yen et al.–"Interdigital Transducers—A Means of Efficient Bulk Wave Exitation", Proc. of the 31st Annual Symposium on Frequency Control, U.S. AERDC, Jun. 1, 1977, pp. 266–270.
Lewis–"Surface Skimming Bulk Waves, SSBW", 1977 Ultrasonics Symposium Proc., IEEE Cat. #77CH1264-ISU; pp. 744–752.
Yen et al.–"Temperature Stable Shallow Bulk Acoustic Wave Devices", Jun. 1978 Proc. of the 32nd Annual Symposium on Frequency Control, May 31–Jun. 2, 1978; pp. 95–101.
Yen–"Shallow Bulk Acoustic Wave Filters", Sep. 25, 1978 at the 1978 Ultrasonics Symposium, IEEE Cat. #78CH1344-ISU, pp. 680–683.

*Primary Examiner*—Marvin L. Nussbaum
*Attorney, Agent, or Firm*—Robert W. Keller; Donald R. Nyhagen

[57] ABSTRACT

Acoustic wave devices employing shallow bulk acoustic waves rather than surface acoustic waves, to provide higher frequencies of operation and other significant advantages, such as less susceptibility to aging and less sensitivity to surface contamination. In each embodiment of the invention, a transmitting transducer and a receiving transducer are oriented on the surface of an anisotropic piezoelectric crystal to achieve substantial coupling of shallow bulk acoustic waves and essentially zero coupling of surface acoustic waves. In one embodiment of the invention, various types of grating filters utilize shallow bulk acoustic waves, and a set of parallel mechanical or electrical discontinuities at or near the surface of the crystal provide reflection of acoustic energy at a frequency determined by the spacing of the discontinuities. Uniformly spaced gratings provide bandpass filter operation, and gratings with graduated spacings provide for frequency compression or expansion. In another embodiment of the invention, variations in device characteristics due to temperature changes are compensated for by directing the shallow bulk waves through materials having favorable or opposite temperature characteristics compared with those of the material into which the waves are originally launched. In other embodiments of the invention, a shallow bulk acoustic wave includes a multistrip coupler, for transferring electroacoustic energy from one propagation path to another, for use in bandpass filters, delay lines or unidirectional transducers.

24 Claims, 21 Drawing Figures

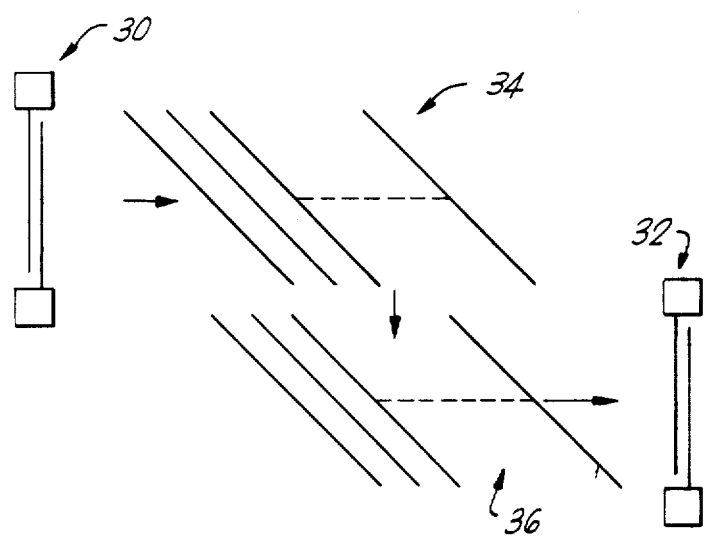
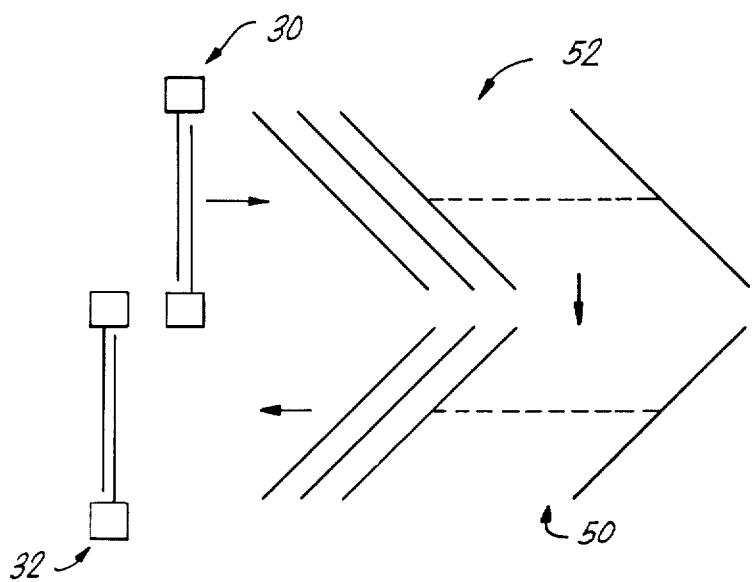
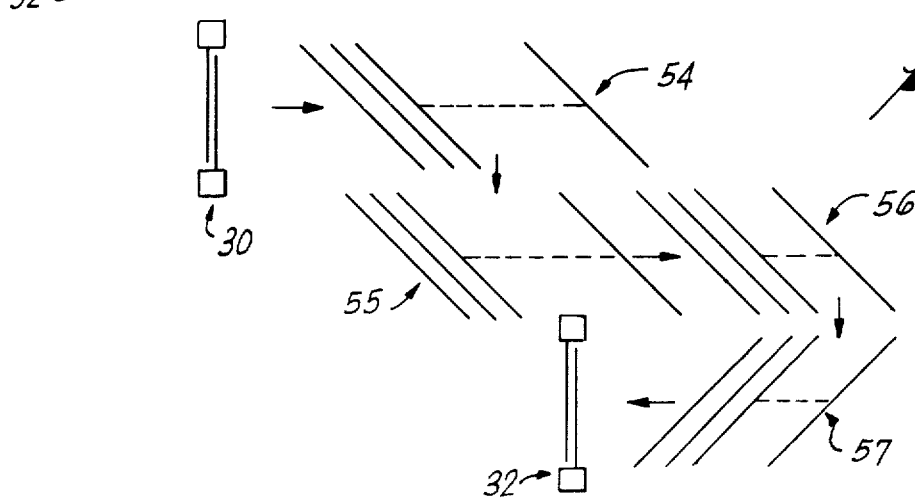

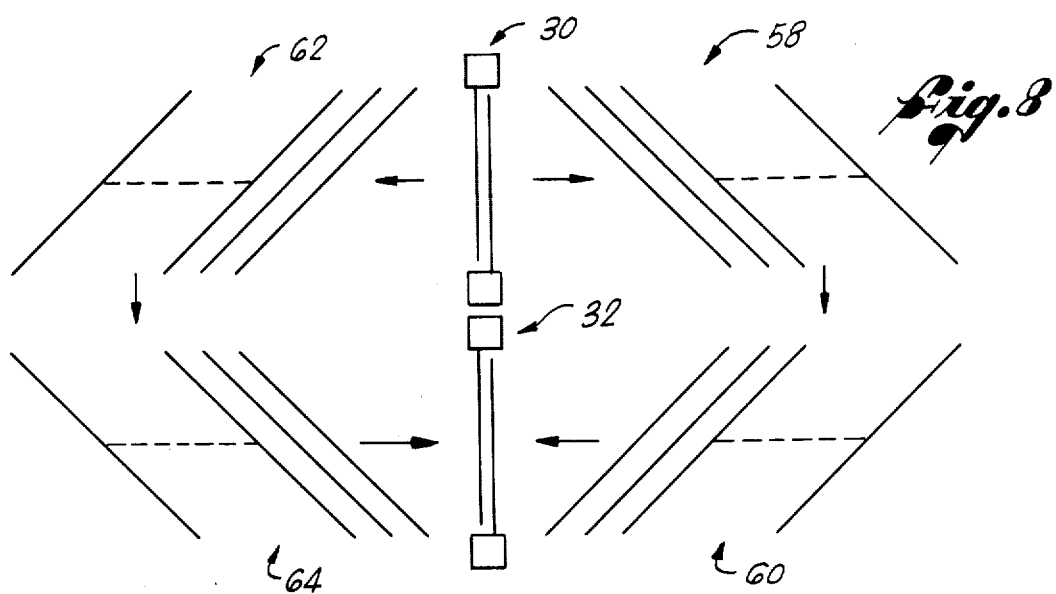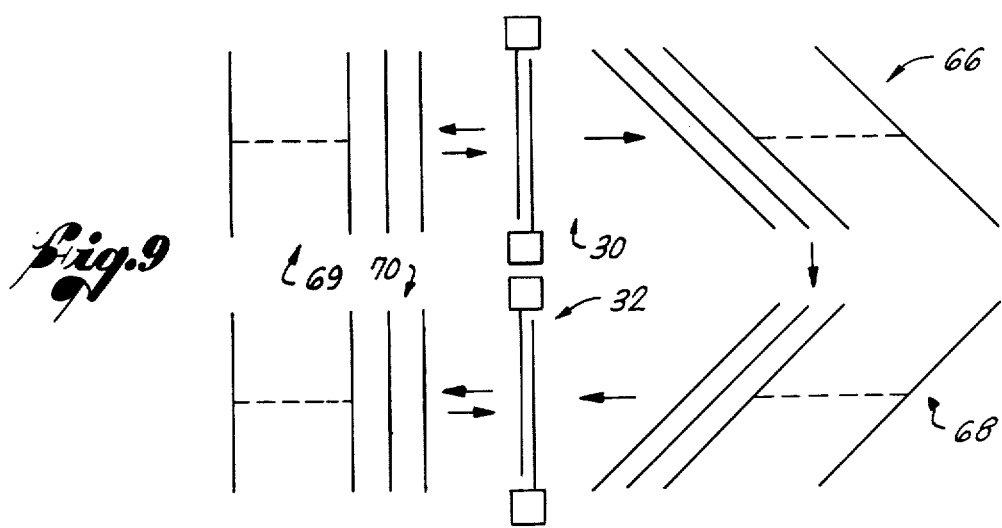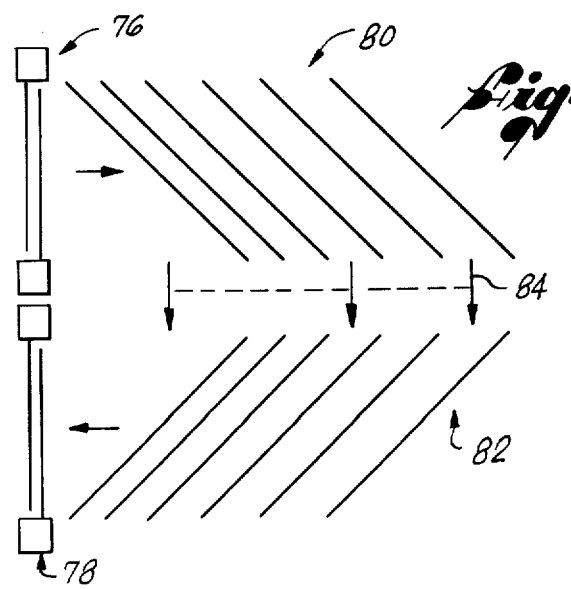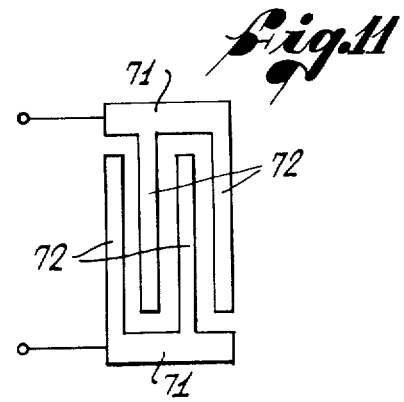

SHALLOW BULK ACOUSTIC WAVE DEVICES

CROSS-REFERENCE TO RELATED APPLICATIONS

This application is a continuation-in-part of U.S. application Ser. No. 861,133, filed On Dec. 16, 1977, now abandoned, and entitled "Shallow Bulk Acoustic Wave Device," and is closely related to the subject matter of U.S. application Ser. No. 818,482, filed on July 25, 1977, now abandoned, and entitled "Shallow Bulk Acoustic Wave Weighted Devices," of which the inventors are Reynold Kagiwada, Kuo-Hsiung Yen and Ke-Li Wang.

BACKGROUND OF THE INVENTION

This invention relates generally to acoustic wave devices, and, more particularly, to acoustic wave devices employed in delay lines, oscillators, filters, and related applications.

In recent years, much research has been performed in the development of acoustic wave devices, primarily for use in communications and radar systems. There is a trend in such systems for operation at increasingly higher carrier frequencies, principally because the spectrum at lower frequencies is becoming relatively congested, and also because the permissible bandwidth is greater at higher frequencies. Congestion of the frequency spectrum is further aggravated by the use of spread spectrum techniques, in which a normally narrowband information signal is spread over a relatively wide band of frequencies, to provide enhanced immunity to noise and interference. Piezoelectric crystals have provided the basis for devices such as oscillators, resonators and filters, operating at very high radio frequencies, but piezoelectric crystals used in conventional modes of operation cannot conveniently meet the demand for higher frequencies in modern systems.

It has been known for some time, of course, that certain crystalline materials have piezoelectric properties. In particular, there is what is sometimes referred to as the direct piezoelectric effect, wherein electrical charges appear on crystal surfaces upon the application of an external stress. There is also a converse piezoelectric effect, wherein the crystal exhibits strain or deformation when an electrical charge is applied by external means to faces of the crystal. These effects have been employed for many years in crystal oscillators and other devices in which bulk acoustic waves are transmitted through a crystal, typically between electrode plates located at opposite faces of the crystal. Use of bulk waves in this manner has provided crystal oscillators and filters with relatively good temperature stability, but with frequencies limited to approximately 200 megahertz (MHz), and more typically falling below 40 MHz. Consequently, higher frequencies cannot be obtained without the expense of additional components, such as frequency multipliers.

In recent years, piezoelectric crystals utilizing surface acoustic waves, rather than bulk acoustic waves, have been developed, with frequencies of operation between 10 MHz and approximately 2 gigahertz (GHz). These surface acoustic wave devices, or "SAW" devices, have a number of advantages over the older bulk acoustic wave devices. In addition to their higher frequency of operation, SAW devices can be designed to have a weighted frequency response. Moreover, they have an operating frequency that is independent of crystal dimensions, and they have a planar structure that is mechanically rugged and can be readily fabricated using conventional semiconductor metalization techniques.

SAW devices utilize interdigital transducers for converting electrical energy into acoustic or mechanical energy, and vice versa. Basically, these transducers comprise metalized layers formed on the crystal surface in finger-like configurations, like the teeth of a comb. The finger-like elements are usually arranged in two sets, with the fingers in the two sets extending in opposite directions, in an interleaved fashion, from respective elongated pads known as sum bars. When an electrical signal is applied to such a transducer, across the sum bars of the two sets of fingers, a surface acoustic wave, also known as a Rayleigh wave, is launched in a direction perpendicular to the transducer fingers. When the surface acoustic wave encounters a second, similarly structured transducer, it is transformed back into an electrical output signal. Typically, a transmitting or input transducer in such a device is excited by an oscillatory electrical signal, either in continuous-wave (CW) mode, or in a pulsed mode of operation.

The frequency of operation of a surface acoustic wave device depends largely on the size and geometry of the transducers. Although an electroacoustical transducer will convert an input electrical signal to an acoustic wave of the same frequency, the transducer has a high insertion loss at frequencies outside a band of frequencies determined by the transducer geometry. A SAW device transducer operates, in effect, like a band-pass filter, the center frequency of which is determined by the spacing between pairs of transducer fingers, and the pass-band width of which is controllable to some degree by the number of pairs of fingers in the transducer. Generally, a transducer with many pairs of fingers will have a narrow-band frequency response, while one with few pairs of fingers will have a wideband frequency response.

Since the spacing of the transducer fingers is directly proportional to the wavelength at operating frequencies, and since the velocity of the acoustic wave is equal to the product of its frequency and its wavelength, it follows that the operating frequency of an acoustic wave device using a particular interdigital transducer is dependent only on the velocity of the acoustic wave. Moreover, since wave velocities in SAW devices are limited by the properties of available crystals, extremely small wavelengths would be required to produce very high frequency devices. To obtain such small wavelengths, interdigital transducers having very small finger spacings must be constructed. However, the fabrication techniques usually used in the manufacture of transducers are those of photolithography, as employed in metalization processes in semiconductor manufacture, and one major problem in further reducing the size of interdigital transducers is that the resolution obtainable in these techniques is limited by the wavelength of the light employed in the photolithographic process.

Another problem with SAW devices is that bulk acoustic waves are often launched into the crystal at the same time as the surface acoustic waves. The bulk waves tend to cause spurious frequency responses that significantly affect the operational integrity of the devices. Furthermore, since the devices utilize a surface acoustic wave, they are sensitive to surface contamination, and sometimes a piezoelectric surface overlay material must be used to enhance the coupling efficiency with which energy is converted between the electrical and acoustic forms. SAW devices also have relatively poor temperature stability, i.e., their frequency of operation varies substantially with temperature. Temperature changes affect the elastic constants relating stress to strain in crystals, and therefore affect the velocity of wave propagation to some degree, depending on the crystal material, type of crystal cut, and direction of propagation. Temperature also affects the physical size of the crystal, and therefore affects finger spacings and propagation delay times. Although some piezoelectric materials, such as ST-but quartz, have good temperature stability properties, they are not good materials for the propagation of surface acoustic waves. SAW devices also have a long term aging problem, due principally to accumulation of surface contaminants and possibly due to gradual relaxation of surface stress conditions caused by surface imperfections.

By way of further background, it is of interest to note that piezoelectricity has been demonstrated in many different crystal materials, but only a few such materials are used in practical transducer design. In both the direct and converse piezoelectric effects, the mechanical strains and stresses are related to electrical parameters, such as charge, voltage and polarization, by constants of proportionality which are referred to as the piezoelectric constants. There are different constants for different directions in the crystal. Furthermore, the mechanical stresses and strains within a crystal are related to each other by elastic constants, there again being different constants for the different directions in the crystal. In the most general case, there are eighteen piezoelectric stress constants and eighteen piezoelectric strain constants, although not all eighteen constants of each type exist in every piezoelectric material. For example, in quartz, one of the most commonly used piezoelectric materials, only five constants have non-zero values, and, by utilizing properties of symmetry within the crystal, only two such constants need be determined in order to completely define the properties of the crystal.

An important parameter in the study of acoustic wave phenomena is the electromechanical coupling coefficient for various types of waves. The efficiency with which electrical energy is converted into acoustic or mechanical energy by an interdigital transducer is highly dependent upon the orientation of the transducer with respect to the crystallographic axes of the piezoelectric material. When the coupling coefficient is zero, it is virtually impossible to launch an acoustic wave into the material. High coupling coefficients, on the other hand, indicate relatively high coupling efficiencies. For example, the coupling coefficient for surface acoustic waves in some cuts of quartz varies from a maximum in one direction of propagation, to zero in another direction.

It has been known for some time that interdigital transducers are sometimes responsible for the propagation of bulk shear waves into the crystal material, as well as surface waves along the crystal surface. For the most part, researchers in the field have focussed on techniques for identifying and eliminating such bulk waves, since they have been regarded as a source of interference with surface waves. However, one group of researchers theorized that bulk shear waves could propagate just beneath the surface of a ceramic material, and another group recognized that such bulk shear waves could be utilized on their own, if the surface waves were appropriately suppressed, as by means of an absorbent surface layer.

It will be appreciated from the foregoing that there is still a significant need for acoustic wave devices capable of operation at higher frequencies than SAW devices, and having none of the inherent disadvantages of SAW devices. The present invention is directed to this end.

SUMMARY OF THE INVENTION

The present invention resides in an acoustic wave device employing shallow bulk waves propagated at a relatively shallow angle just below the surface of a piezoelectric crystal. Basically, and in general terms, the device of the invention in its broadest sense comprises a pair of electroacoustic interdigital transducers, and means defining a transmission path for the propagation of shallow bulk acoustic waves from one transducer to the other, the means defining a transmission path including a block of anisotropic crystalline material having a surface into which both surface acoustic waves and shallow bulk waves can be propagated, and the transducers being so oriented on the surface that the electromechanical coupling coefficient is practically zero for surface waves but is substantial for shallow bulk waves.

Experiments have shown that a shallow bulk acoustic wave (SBAW) is unaffected by deep grooves cut from the reverse or bottom face of the crystal, i.e., the face opposite the transducers, that it is not reflected from the bottom face, and that it is relatively unaffected by surface conditions of the crystal. It has also been determined that the coupling coefficient for shallow bulk acoustic waves depends on the axis of orientation of the transmitting transducer with respect to conventionally defined crystallographic axes of the crystal, and that it is possible to select an orientation of the transmitting transducer which minimizes the coupling coefficient for surface acoustic waves, while at the same time providing a relatively large electromechanical coupling coefficient for shallow bulk acoustic waves.

The principal advantage of shallow bulk acoustic wave devices over surface acoustic wave devices stems from the higher velocity of propagation of shallow bulk acoustic waves as compared to that of surface acoustic waves. Higher frequencies can be obtained, therefore, without reduction in the interdigital finger spacings. Alternatively, the finger spacings can be made correspondingly larger for the same frequency, in order to facilitate fabrication of the devices. Other advantages are that shallow bulk acoustic wave devices have a lower response to spurious signals of the bulk or surface acoustic wave type, and are less sensitive to surface contamination and surface imperfection than devices of the surface acoustic wave type.

In one fundamental application of the invention, an input signal is transmitted through the crystal from one transducer to the other, and the device acts as an acoustic delay line. When the device is connected to provide a narrowband feedback path for an external amplifier, an oscillator is obtained.

In one embodiment of the invention, the means defining a transmission path between the transducers also includes at least one set of reflective elements. The reflective elements form a grating filter, which is operative to reflect an acoustic wave very strongly, but only in a narrow frequency band. Basically, as is known in SAW technology, grating filters are mechanical or electrical discontinuities at or near the surface of a crystal in which acoustic waves are transmitted. The discontinuities may, for example, be a plurality of unconnected metalized strips oriented at approximately 45 degrees to the direction of propagation of the wave, so that the wave within the frequency band of the filter will be reflected through approximately 90 degrees.

Basically, in accordance with this aspect of the invention there is a first set of reflective elements located at the surface of the piezoelectric material and inclined to a first propagation direction, the reflective elements being operative to change the direction of predetermined frequency components of the acoustic wave, and at least one other set of reflective elements, operative to reflect predetermined frequency components of the acoustic wave so as to be parallel with the first propagation direction.

In one disclosed embodiment of the invention as it relates to grating filters, the sets of reflective elements are spaced in such a manner that each set of elements functions as a narrow bandpass filter, the center frequency of which is determined solely by the spacing of the elements. In particular, the spacing between elements, measured in the first propagation direction between corresponding points on the elements, is equal to the wavelength at the center frequency. The first set of reflective elements is oriented at approximately 45 degrees to the first propagation direction, thereby reflecting the acoustic wave through approximately 90 degrees, and the second set of reflective elements is oriented parallel to the first set, in order to reflect the acoustic wave again through approximately 90 degrees into the first direction of propagation, whereupon it is received by the receiving transducer. Alternatively, the second set of reflective elements may be oriented at 90 degrees to the first set, whereby selected frequency components of the acoustic wave are reflected in a direction 180 degrees from the first propagation direction. Further sets of reflective elements may be arranged in the path of the reflected acoustic wave to provide a cascading effect, the final set of elements being oriented to reflect the acoustic wave to be parallel with the first propagation direction.

Since interdigital transducers are basically bidirectional devices, a more efficient grating filter device can be obtained by providing two sets of reflective elements disposed at approximately 45 degrees to the propagation direction, with one set disposed on each side of a transmitting transducer. The acoustic energy is then effectively split into two waves, which are reflected by the respective sets reflective elements, so that the two reflected waves are propagated parallel to each other. Two additional sets of reflective elements are disposed in the path of the two reflected waves, again at approximately 45 degrees to the new direction of propagation, so that the two waves are reflected back towards each other, and towards a receiving transducer.

A variation of this configuration, known as a ring grating filter, is a half-ring grating filter, whereby the energy transmitted from one side of a transmitting transducer encounters two sets of inclined reflective elements before being received by a receiving transducer, while the energy transmitted from the other side of the transmitting transducer is reflected from another set of reflective elements oriented in a parallel relationship with the transmitting transducer fingers. The parallel grating reflects energy that would otherwise be lost from the bi-directional transmitting transducer. In similar fashion, a fourth set of reflective elements in positioned in a parallel relationship with the receiving transducer, to reflect energy that would otherwise pass through the receiving transducer and be lost.

In another important application of the principles of the invention, each of the sets of reflective elements has non-uniformly spaced elements, the spacings increasing linearly from a relatively close spacing at one end of the set to relatively wide spacing at the other end, and the interdigital transducers used are capable of processing a relatively wide band of frequencies. If for example, the reflective elements first encountered by a shallow bulk acoustic wave from the transmitting transducer are relatively closely spaced, the frequency components corresponding to the spacing of those elements will be strongly reflected by the reflective elements, while the lower frequencies, corresponding to the relatively wider spacings, will be transmitted through the initially encountered reflective elements. The lower frequency components will, therefore, travel further into the set of reflective elements before being reflected.

A second set of reflective elements is provided with spacings corresponding to those of the first set, to reflect the frequency components back toward a receiving transducer. However, because the lower frequency components have traveled a greater distance than the components of higher frequency, the lower frequency components are significantly delayed in time with respect to the higher frequency components. The net effect is that of a frequency expanding process. Depending on the nature of the input signal supplied to the transmitting transducer, and also on the relative arrangement of the reflective elements spacings, the same system can be used to compress the frequency spread of an input signal.

In accordance with another aspect of the invention, the means defining a transmission path between the transducers also includes means for compensating for the effects of temperature on the velocity of shallow bulk acoustic waves. In general, the temperature compensating means includes a portion of piezoelectric material, selected such that, when shallow bulk acoustic waves are propagated through it in a selected direction, the temperature coefficient of velocity change is more favorable than the corresponding temperature coefficient in the material into which the waves were originally launched from the sending transducer.

More specifically, in one particular variation of this embodiment, the temperature compensating means includes reflective means disposed in the path of the transmitted shallow bulk wave, to reflect the wave to a direction having a low temperature coefficient, or having a coefficient opposite in sign to the coefficient corresponding to the original propagation direction. Also included are second reflective means, for reflecting the wave back to the original direction again, to facilitate coupling with the receiving transducer.

In another variation of this embodiment, the piezoelectric material into which the shallow bulk wave is launched is bonded to a different material having either a lower temperature coefficient, or one of different sign from the material into which the wave is propagated. The different material is also bonded to another portion of the original material, to provide efficient coupling with the receiving transducer. In yet another variation of this embodiment, the different material is deposited as a layer in an ion-etched region of the original block of piezoelectric material. In both cases where a different material is used, the boundaries between materials do not significantly affect the propagation of shallow bulk waves, and a practical temperature-compensated device is obtained without any sacrifice in performance characteristics.

In accordance with yet another embodiment of the invention, the means defining a transmission path between the transducers further includes a multistrip coupler for effecting transfer of energy in a shallow bulk wave from a first propagation path to a second propagation path not necessarily aligned with or parallel with the first. More specifically, the coupler comprises a set of uniformly spaced metalized strips arranged in parallel or concentric relation. In one form of this embodiment the strips are straight and parallel, and are employed in a bandpass filter to allow the use of weighted transducers at both sending and receiving ends. In another form, both parallel and U-shaped sets of strips are employed to provide an extended length transmission path for a delay line, and in yet another form of the device, a U-shaped set of strips surrounding an interdigital transducer provides unidirectional properties to the transducer.

It will be appreciated from the foregoing that the aforedescribed shallow bulk acoustic wave devices represent significant advances over similar devices utilizing surface acoustic waves. In particular, higher frequencies can be obtained for the same interdigital finger spacings, or the finger spacings can be made correspondingly larger for the same frequency in order to facilitate fabrication of the devices. Moreover, shallow bulk acoustic wave devices have a lower susceptibility to spurious signals of the bulk type or of the surface acoustic wave type, and are less sensitive to surface contamination and to the presence of surface imperfections than are devices of the surface acoustic wave type. Other aspects and advantages of the invention will become apparent from the following more detailed description, taken in conjunction with the accompanying drawings.

BRIEF DESCRIPTION OF THE DRAWINGS

FIG. 5 is a simplified plan view of a grating filter of the type in which the present invention can be utilized;

FIG. 6 is a simplified plan view of a grating filter similar to that shown in FIG. 5, but of different configuration;

FIG. 7 is a simplified plan view of a cascaded grating filter similar to that shown in FIG. 5;

FIG. 8 is a simplified plan view of a ring grating filter of the type in which the present invention can be utilized;

FIG. 9 is a simplified plan view of a half-ring grating filter of the type in which the present invention can be utilized;

FIG. 10 is a simplified plan view of a frequency expanding reflective array device in which the present invention can be utilized;

FIG. 11 is a more detailed plan view of an interdigital transducer of the type employed in the devices utilizing the present invention;

DESCRIPTION OF THE PREFERRED EMBODIMENTS

Figure 1:
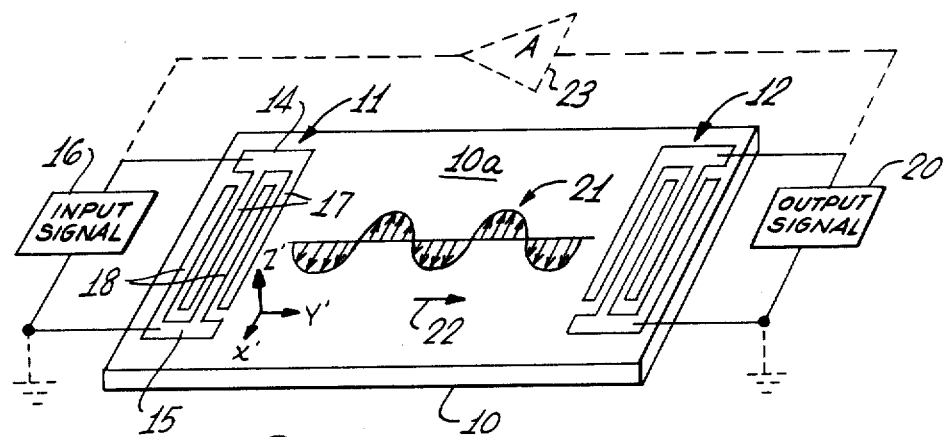
FIG. 1 is a simplified perspective view of a shallow bulk acoustic wave device embodying the principles of the present invention.

As shown in the drawings for purposes of illustration, the present invention is concerned with acoustic wave devices employing interdigital transducers. Devices having the same functions as those with which the invention is concerned are known in the surface acoustic wave art. However, surface acoustic wave devices suffer from a number of significant limitations, principally with respect the maximum frequency at which they can operate, againg characteristics, temperature characteristics, and susceptibility to surface contamination.

In accordance with the present invention, higher frequency of operation, superior temperature and aging characteristics, and minimized susceptibility to surface contamination are provided by utilizing shallow bulk acoustic waves in the operation of delay lines, oscillators, filters, temperature-compensated devices, couplers, and related devices.

As shown in diagrammatically in FIG. 1, a device for generating shallow bulk acoustic waves in accordance with the present invention includes a block of a suitable piezoelectric material, indicated by reference numeral 10. The block 10 may, for example, consist of a quartz crystal of a particular cut.

By way of a more specific example, a y-cut quartz plate is cut in such a manner that the parallel major faces of the plate are perpendicular to the y axis of the crystal. A rotated y-cut quartz is a cut where the parallel faces of the plate or block intersect the y axis at a non-zero angle. The block 10 may consist of rotated y-cut quartz. Standard rotated y cuts are referred to as the ST-cut, BT-cut, or AT-cut. The ST-cut quartz is a cut rotated from the y axis by 42.75°, which simply means that the parallel major faces of the cut intersect the y axis at this angle. The AT-cut quartz is a cut rotated through 35° 15' from the y axis in a positive direction. The BT-cut quartz is rotated in the opposite direction through −49°. All these cuts are well known in the art and are commercially available; for example, from the Valpey-Fisher Corporation in Hopkins, Mass. Alternatively, the block 10 may consist of either lithium niobate ($LiNbO_3$) of lithium tantalate ($LiTaO_3$).

As discussed above, the physical piezoelectric properties of the anisotropic piezoelectric crystal 10 depend on the direction of propagation of an acoustic wave. This is also true of the temperature dependence of the device. It is, of course, desirable that the temperature dependence be as low as possible, that is, that the physical properties of a crystal, such as the wave velocity, change very little, if at all, over a certain temperature range. The operating parameters of such a device should then be stable over this temperature range. Hence, it is important that the shallow bulk acoustic wave devices of the invention should have a low temperature dependence.

The block 10 has a planar top surface 10a, and an electroacoustic input transducer 11 and an electroacoustic output transducer 12 are disposed on the surface. The transducers 11 and 12 are of the interdigital type and are formed from conductive material. Transducer 11 consists of two pads 14 and 15, known as sum bars, between which an input signal obtained from an input signal source 16 is applied. A pair of fingers 17 extend from transducer pad 14 and another pair of fingers 18 are connected to the transducer pad 15 and interleaved with the fingers 17, although it will be understood that the number of fingers in the transducer is largely a matter of design choice. Transducer 12 is essentially identical to transducer 11, and the two transducers are so oriented that the input transducer 11 launches a shallow bulk acoustic wave, which in turn is received by the output transducer 12 and is transformed again into an electric signal that is applied to the output signal detector 20.

As a further necessary background to an understanding of the invention, it should be again noted that single-crystal piezoelectric materials are anisotropic and have conventionally defined x, y and z crystallographic axes. Moreover, most of the physical properties of an acoustic wave transmitted in such a crystal depend on the direction in which the wave travels with respect to the crystallographic axes. For example, the direction of propagation directly affects the velocity of an acoustic wave, as well as the degree to which temperature changes affect the velocity. It is, of course, critical to the present invention that the transducers 11 and 12 in FIG. 1 are oriented with respect to the crystallographic axes so as to launch a substantially pure shear wave of the shallow bulk type.

A measure of the efficiency with which such a transducer converts electrical energy into acoustic energy, and vice versa, is provided by a parameter known as the electromechanical coupling coefficient, sometimes known as the piezoelectric coupling coefficient. This coupling coefficient depends on the piezoelectric properties of the crystal, and is also dependent on the direction of propagation. It may be defined as the ratio of the mutual elastic and dielectric energy density to the geometric mean of the elastic and dielectric self-energy densities. In mathematical terms, the coupling coefficient may also be defined as follows:

$$k^2 = (U_m^2 / U_e U_d)$$

where $k^2$ is the electromechanical coupling coefficient, $U_m$ is the mutual energy, $U_e$ is the elastic energy and $U_d$ is the dielectric energy. The coupling coefficient is also approximately proportional to $2\Delta V/V$, where V is the actual velocity of the wave and $\Delta V$ is the difference between a velocity obtained mathematically without taking into account the piezoelectric properties of the crystal, and the actual velocity obtained by calculation, considering the piezoelectric properties.

As the electromechanical coupling coefficient approaches zero for a particular type of acoustic wave, this type of wave cannot be launched into the crystal. For a shallow bulk acoustic wave device, the electromechanical coupling coefficient should be as large as possible for the shallow bulk acoustic wave and should be as small as possible for the surface acoustic wave. Otherwise a surface acoustic wave may be also launched, and may give rise to unwanted spurious responses. By way of example, for certain cuts of quartz, the transducers should be disposed along a line that is substantially normal to the x direction to minimize surface acoustic wave coupling.

By way of further background, the direction in which a plate is cut from a crystal, with respect to the x, y and z crystallographic axes, determines the type of cut by which the plate is designated. For example, a plate cut with its faces perpendicular to the x axis direction is an x-cut crystal, and one cut with its faces perpendicular to the y axis is a y-cut crystal. In addition, there are "rotated cuts" taken through planes not perpendicular to any of the principal crystallographic axes. In rotated y cuts the cutting plane is rotated from the y-cut plane, essentially about the x axis, and the various standard rotated y cuts are given alphabetic designations corresponding to particular angles of rotation from the y-cut position. For example, there are the AT cut at +35° 15' from the y-cut position, the BT cut at −49° from the y-cut position, the CT cut at +38° from the y-cut position, and so on.

In accordance with another convention used herein, the principal geometric axes of the cut piezoelectric crystal are referred to by x', y' and z', since it will be apparent that, for any rotated cut, the axes of the cut crystal are not necessarily the same as the crystallographic axes of the uncut crystal. For a rotated y-cut crystal, the x and x' axis will be identical, since the rotation is about the x axis, but the y and y' axes will be different, as will the z and z' axes. For rotated y-cut quartz, the electromechanical coupling coefficient for surface acoustic waves is practically zero in a direction between 80° and 100° from the x or x' axis, while the corresponding coupling coefficient for shallow bulk acoustic waves is relatively high. Accordingly, the transmitting and receiving transducers 11 and 12 should be aligned at approximately 90° to the x axis for rotated y cuts of quartz, in order to minimize surface acoustic waves and maximize coupling efficiency of shallow bulk acoustic waves.

It is possible to calculate the wave velocities and coupling coefficients for various types of bulk waves and various cuts of crystals. From these calculations one may select a particular type of shallow bulk wave providing a substantial coupling coefficient in a selected direction, such as the 90° direction with respect to the x axis, in which direction the coupling coefficient for surface acoustic waves is essentially zero.

Preparatory to selecting an appropriate direction of propagation, a set of linear equations can be set up describing the acoustic wave propagation in an arbitrary anisotropic piezoelectric medium. This is usually done in standard tensor notation. Thus there are equations of motion; linear, strain-mechanical displacement relations; and equations derived from Maxwell's equations under the quasi-static assumption. In addition, there are linear piezoelectric constitutive relations. The following two sets of equations may be derived:

$$c'_{ijkl}\frac{\partial^2 u_k}{\partial l \partial i} + e'_{kij}\frac{\partial^2 \phi}{\delta k \partial i} = \rho \frac{\partial^2 u_j}{\partial t^2} \quad (1)$$

$$e'_{ikl}\frac{\partial^2 u_k}{\partial l \partial i} - \epsilon'_{ik}\frac{\partial^2 \phi}{\partial k \partial i} = 0 \quad (2)$$

where $c'_{ijkl}$ are the elastic constants taken with respect to ijkl, which are the four indices; $e'_{ijk}$ are the piezoelectric constants and $\epsilon'_{ij}$ are the dielectric constants; further $u_jU_k$ is the mechanical displacement; $\phi$ is the electric potential and $\rho$ is the mass density. Each of the four indices i, j, k, l can separately assume any one of the three numbers 1, 2 or 3. Hence if all permutations are physically possible, equation (1), for example, represents a set of 81 equations, while equation (2) represents a set of 27 equations. These equations can be resolved to find all bulk waves that exist. In this case, it is assumed that the piezoelectric material has no boundaries. Hence the results are accurate within the interior of the piezoelectric block. This means that reflections of the bulk waves in a physical boundary are not taken into account.

In order to derive properties of various bulk acoustic waves from these equations, one first assumes the form of the solution. For a planar bulk wave, the solutions for mechanical displacements and electric potentials will have the following form:

$$u_i = \beta_i e^{j\omega(t - x1/v)} \quad (3)$$

$$\phi = \beta_4 e^{j\omega(t - x1/v)}$$

$$i = 1,2,3\ldots,$$

where $\beta_i$ are constants and $x_1$ is distance measured in the direction of propagation. Substituting these into equations (1) and (2) results in a 4×4 matrix times the vector matrix of the unknown $\beta$'s.

$$\begin{bmatrix} (-c'_{11} + \rho v^2) & -c'_{16} & -c'_{15} & -e'_{11} \\ -c'_{16} & (-c'_{66} + \rho v^2) & -c'_{56} & -e'_{16} \\ -c'_{15} & -c'_{56} & (-c'_{55} + \rho v^2) & -e'_{15} \\ -e'_{11} & -e'_{16} & -e'_{15} & \epsilon'_{11} \end{bmatrix} \begin{bmatrix} \beta_1 \\ \beta_2 \\ \beta_3 \\ \beta_4 \end{bmatrix} = 0 \quad (4)$$

For a non-trival solution of the $\beta$'s to exist, the determinant of the 4×4 matrix must be zero. By setting the determinant equal to zero, one obtains a sixth-order polynomial in v of the form:

$$v^6 + pv^4 + qv^2 + r = 0. \quad (5)$$

This sixth-order polynomial is then solved for the three (in general) positive and real velocities $v^{(j)}$ corresponding to the physical solutions, using numerical computational methods, and preferably by computer.

Once the velocities of each mode are determined, one can also calculate all the mechanical displacements and electric potential associated with the mode. For each particular velocity, a set of $\beta$'s can be found that satisfies equation (4). The mechanical displacements and electric potential are then given directly by substituting the $\beta$'s and v to equation (3).

The electromechanical coupling coefficient for each mode can be calculated from the expression $k^2 = 2\Delta v/v$. $\Delta v$ is the difference between v as already determined from equation (5) and a velocity similarly determined, but with all of the piezoelectric effects neglected by setting all values of e' to zero in the matrix of equation (4).

Using this technique, it is possible to calculate the velocities and coupling coefficients for various bulk acoustic waves, such as y-rotated quartz cuts like the ST, AT and BT cuts. Since the coupling coefficient for surface acoustic waves at 90° from the x' axis, that is the direction of the y' axis, approaches zero, the calculations with respect to the bulk waves were carried out for this orientation in accordance with equations (1)–(5) and the results are shown in Table 1.

TABLE 1

| Quartz Substrate Orientation | Bulk Wave | Wave Velocity (m/sec) | Electromechanical Coupling Coefficient $k^2$ (%) |
|---|---|---|---|
| ST-cut | longitudinal | 6131 | 0 |
| 90° off x' axis | fast shear | 5053 | 0.36 |
| or the direction of the y' axis | slow shear | 3792 | 0 |
| AT-cut | longitudinal | 6272 | 0 |
| 90° off x' axis | fast shear | 5099 | 0.20 |
|  | slow shear | 3741 | 0 |
| BT-cut | longitudinal | 7024 | 0 |
| 90° off x' axis | fast shear | 3900 | 0 |
|  | slow shear | 3367 | 0.50 |

From the above table, it will be seen that, for example, for ST-cut quartz in the direction of the y' axis the fast shear bulk wave which has the largest wave velocity and a non-zero coupling coefficient has a velocity of 1.6 times that of SAW waves in the direction of the x axis. The velocity of SAW waves for ST-cut quartz in that direction is 3,157 (m/sec), while the fast shear bulk wave has a velocity of 5053 (m/sec). It also follows from the above table that, for ST-cut quartz, as well as for AT-cut quartz, the fast shear waves may be used because they have a substantial coupling coefficient for shallow bulk acoustic waves. On the other hand, for BT-cut quartz the slow shear wave must be used because it is the only one that has a substantial coupling coefficient for shallow bulk acoustic waves.

It will be evident that similar calculations by means of equations (1)–(5) may be carried out for other quartz cuts, such as double-rotated y cuts, and for different materials, such as lithium niobate or lithium tentalate.

As shown schematically at 21 in FIG. 1, the shallow bulk wave is a pure shear wave which propagates somewhat below the surface of block 10. It vibrates normal to its direction of propagation and substantially parallel to the plane surface 10a of the crystal. It will be obvious that the shallow bulk acoustic wave 21 is shown only schematically, because it actually propagates below the surface 10a of the block 10 at a shallow angle. It has been found that the angle ($\theta$) of the shallow bulk wave with respect to the crystal major face 10a depends approximately on the number of pairs of fingers of the interdigital transducer, according to the following formula:

$$\theta = \sqrt{\frac{2}{N}}, \quad (2)$$

where $\theta$ is the angle in radians between the direction of propagation of the shallow bulk acoustic wave and the major face 10a of the block 10, and N is the number of pairs of fingers of the input transducer 11.

Note that there are various species of bulk waves which can be excited in a piezoelectric block depending on the material and direction of propagation of the acoustic waves. Some of these waves vibrate in a longitudinal direction while others vibrate in a vertical or horizontal direction. Among the shear waves are "fast" and "slow" shear waves depending on their relative velocity, and it is desirable to search mathematically, as described above, for a shear wave capable of being launched in a particular material, and to orient the transducers in the desired direction to launch the selected wave. A selection among several possible waves can also be made to minimize the temperature dependence of the waves. Thus it has been found that the temperature dependence of shallow bulk wave devices utilizing BT-cut and AT-cut quartz, where the transducers are oriented normal to the direction of propagation of surface acoustic wave, is better and more stable than that of the more stable surface acoustic wave cuts such as ST-cut quartz.

A critical factor to be considered is the electromechanical or piezoelectric coupling coefficient previously referred to. This coupling coefficient should be as large as possible for shallow bulk acoustic waves so that this type of wave is excited with maximum efficiency. On the other hand, the coupling coefficient for surface acoustic waves should be as small as possible, and preferably should be zero, so that no surface acoustic waves can be launched. If any surface acoustic wave is also generated in a shallow bulk acoustic wave device, it may cause spurious responses in a frequency range where such responses are undesirable.

Figure 2:
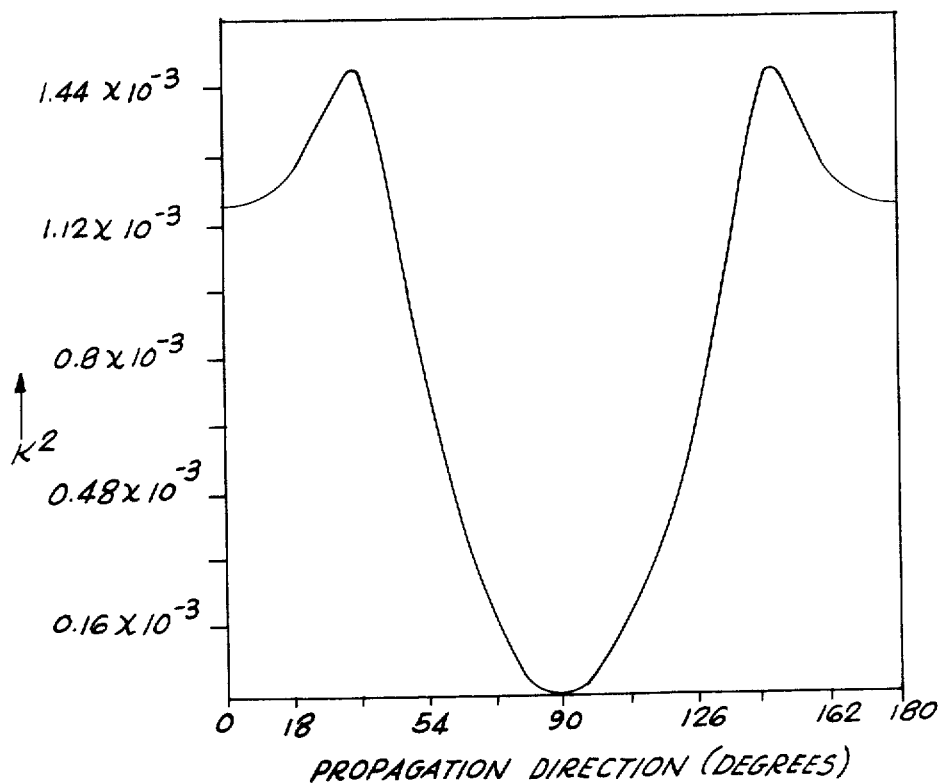
FIG. 2 is a graph relating the propagation direction in degrees to the surface acoustic wave electromagnetic coupling coefficient for ST-cut quartz.

Referring now to FIG. 2, there is illustrated by way of example a plot of the electromechanical coupling coefficient ($k^2$) versus the propagation direction in degrees for surface acoustic wave on ST cut quartz. The angles 0° and 180° correspond to the positive and negative direction of the x' axis. On the other hand, 90° corresponds to the direction of the y' axis. Hence at 0° and 180° a surface acoustic wave will readily propagate, as will be evident from the relatively high values of its coupling coefficient. Peaks of the curve of FIG. 2 are at approximately 40° and 140°. However, at those two points the temperature stability characteristics are less favorable. Such temperature instability is quite undesirable in some electrical components and, therefore, it is preferred to operate a SAW device using ST-cut quartz in the direction of the x' axis, that is at 0° or 180°, to provide a good coupling of the surface acoustic wave, together with good temperature stability.

It will be noted that, at 90° from the x' axis, that is in the direction of the y' axis, the acoustic coupling coefficient $k^2$ for a surface acoustic wave disappears completely. On the other hand, for shallow bulk acoustic waves, the acoustic coupling coefficient $k^2$ at 90° is large. Therefore, shallow bulk acoustic waves may be efficiently generated at 90° from the x' axis, that is, in the direction of the y' axis for any rotated y-cut quartz. In that direction, since the coupling coefficient for surface acoustic waves is very low, such surface waves will generally not be launched and therefore are unable to cause spurious responses.

Experiments have shown that a shallow bulk acoustic wave which has been launched in accordance with the present invention does not travel on the surface of the crystal. This has been proven by disposing an acoustic absorber such as a paper cement on the surface of the block 10. Nevertheless, the wave travels unimpeded toward the output transducer 12. It can also be shown that the shallow bulk wave does not extend through the entire thickness of the block 10. For example, the bottom surface of the block 10 may be sandblasted or otherwise roughened to prevent reflection of a bulk acoustic wave from the bottom surface. It has been found that transmission of the shallow bulk acoustic wave is not impeded by such a roughened bottom surface.

Additional experiments have been carried out on a quartz block having a thickness of about 1.016 mm. A groove was cut on the top surface of a depth of about 0.2 mm and the signal then completely disappeared, indicating that the shallow bulk wave must be present near this depth and must therefore travel close to the top surface. It will be recalled that the shallow bulk acoustic wave actually descends at an angle to the surface and that the angle of descent depends on the number of pairs of fingers of the interdigital transducer. In another experiment a groove was cut from the bottom surface of the block to a height of about 0.9 mm between the two transducers 11 and 12. Within the indicated thickness of the crystal this leaves a clearance of about 0.116 mm. In this case, the output signal remained undisturbed and was able to pass through the crystal unimpeded, again indicating that shallow bulk acoustic waves travel close to the top surface.

It has also been found that a shallow bulk acoustic wave device provides a low insertion loss. An insertion loss is generally defined as the loss in power due to the insertion of the device at some point in the circuit or system. It is generally expressed as a ratio in decibels (db) of the power received at the load without the device to the power received at the load after the device is inserted.

Depending on the crystal orientation and the material, a shallow bulk acoustic wave travels about 1.1 to 2.0 times faster than a SAW wave. Moreover, the frequency of a device utilizing a shallow bulk acoustic wave is independent of the dimensions of the block or crystal. The frequency range of a typical shallow bulk acoustic wave device is between about 10 MHz and about 3 GHz. It also has a good temperature stability which, for some cuts, is better than the best temperature stability characteristic of a SAW device.

Figure 3:
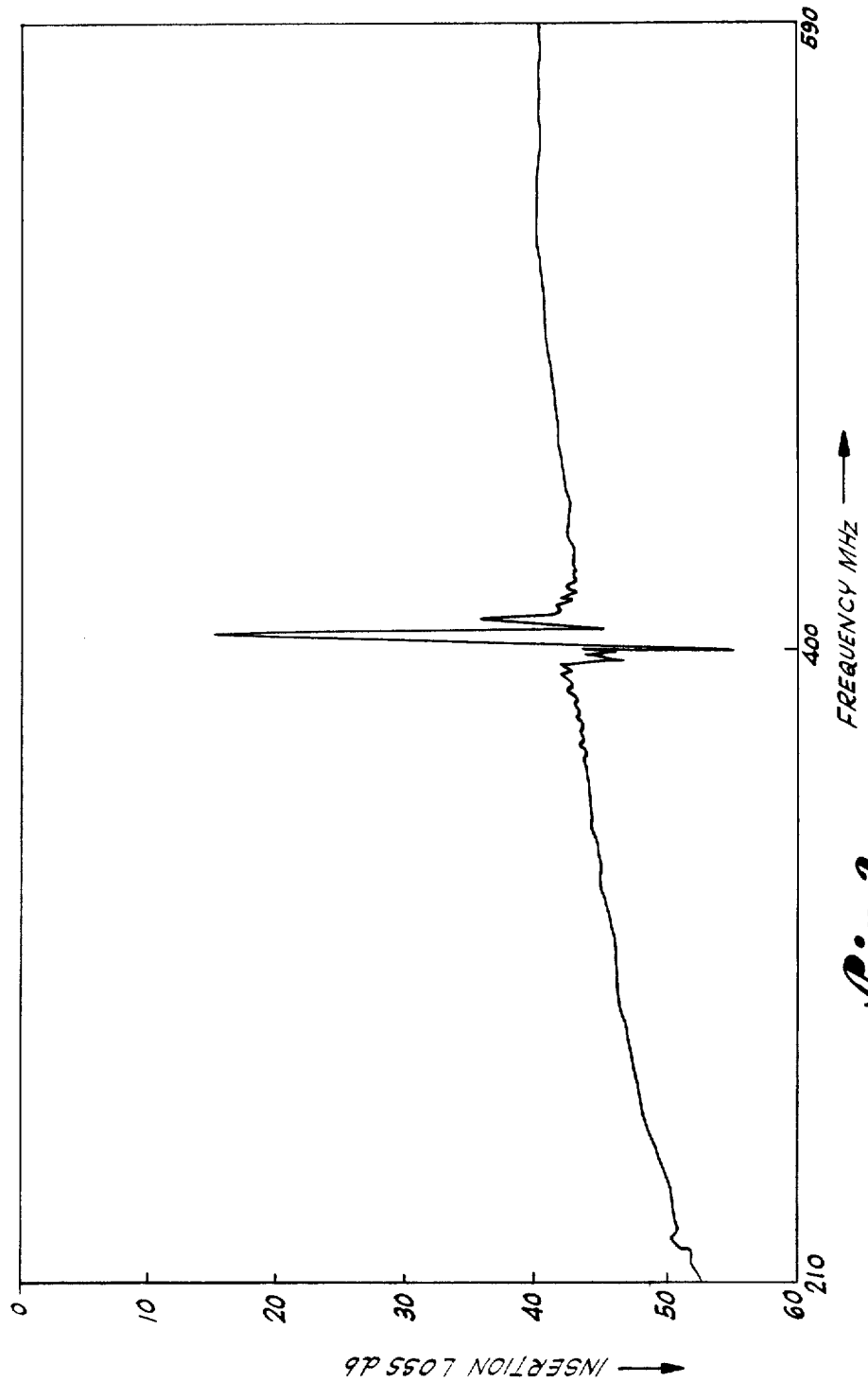
FIG. 3 is a graph plotting the frequency response of a shallow bulk acoustic wave device using a Y-rotated cut quartz crystal, i.e., the insertion loss in db as a function of frequency in megahertz (MHz)

FIG. 3 shows the frequency response of a shallow bulk acoustic wave device plotted with respect to the insertion loss in db as previously defined. The device of which the response is shown is used as a delay line and employs conventional interdigital transducers. One of the transducers consists of 149 fingers while the other has 75. The width of each finger and the gap between two adjacent fingers are both 3.157 micrometers, and the center-to-center distance between input and output transducers is 106 wavelengths.

If this delay line is fabricated on ST cut quartz, it will propagate a surface acoustic wave in the x' direction over a 40 mil thick substrate at a center frequency of 250 MHz. The frequency response or insertion loss of the curve of FIG. 3 was obtained with a shallow bulk acoustic wave device utilizing a rotated y-cut quartz forming an angle of 34.15 degrees with respect to the y' axis. This is a typical frequency response curve where the electroacoustic transducers are disposed to launch a wave in the direction of the y'-axis, as contrasted with a corresponding SAW device in which the wave travels in the direction of the x'-axis. Note that the frequency curve is free of spurious responses due to the excitation of an undesired surface acoustic wave.

Figure 4:
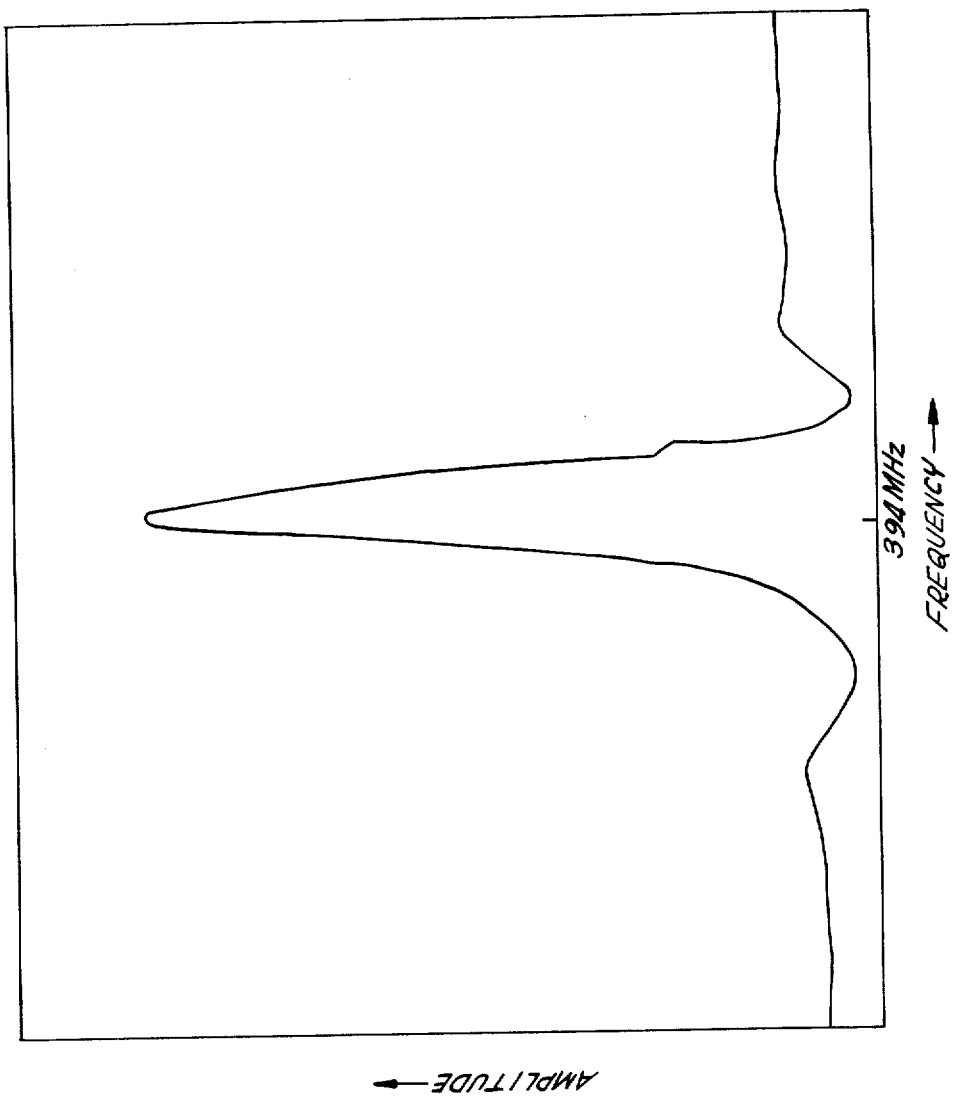
FIG. 4 is a graph plotting the variation of amplitude as a function of frequency, for a delay line manufactured in accordance with the present invention.

Similarly, FIG. 4 plots frequency versus amplitude for a shallow bulk acoustic wave device. This was obtained with an ST-cut quartz having parallel faces forming an angle of 42.75° with the y-axis. The shallow bulk acoustic wave device of which the response has been plotted in FIG. 4 also has been used as a delay line and employs conventional interdigital transducers of the same design as those described with reference to FIG. 3.

This delay line was also fabricated on ST-cut quartz, with an acoustic wave propagated in the x' direction over a 40 mil thick substrate at a center frequency of 250 MHz. This orientation of the transducers will, of course, result in the launching of a surface acoustic wave, and the device will have an insertion loss of about 16 db. On the other hand, when this delay line was fabricated on ST-cut quartz with the transducers oriented to launch a wave normal to the x' axis, that is, in the direction of the y' axis, the device has a center frequency of about 349 MHz as shown in FIG. 4, with the insertion loss again at about 16 db. The device as thus used as a delay line has only a single mode of operation and no spurious response.

It will be appreciated that a delay line represented by a shallow bulk acoustic wave device is capable of operating at higher frequencies than a corresponding surface acoustic wave device. Such delay lines can, of course, be used as the feedback path of a very high frequency oscillator. Hence it will be evident that the shallow bulk acoustic wave device of the present invention can be utilized in oscillators operable at frequencies up to 3 GHz. Moreover, because of their excellent temperature characteristics, they form very stable oscillators.

As shown diagrammatically in FIG. 1, such an oscillator could be obtained by connecting the output signal 20 to the input of an amplifier 22, the output of which is connected to supply the input signal 16 to the delay line. As will by now be readily apparent, devices utilizing shallow bulk acoustic waves combine some of the advantages of surface acoustic wave devices with some of those of bulk acoustic wave devices, and may be used for almost any purposes for which surface acoustic wave devices are used. For example, and as will now be further explained, they are suitable for use as delay lines, bandpass filters, oscillators and the like. They feature higher frequency of operation with the same size of transducer, which, in turn, reduces the requirements of photolithographic resolution by means of which the transducers are made. Since shallow bulk waves do not travel on the surface, the devices are virtually immune to surface defects. Additionally, as will be also further explained, they can be adapted to have improved temperature stability, which means that their operating characteristics do not change significantly over a given temperature range.

The shallow bulk acoustic wave generated by these devices will have a frequency approximately 1.1 to 2.0 times higher than that of a surface acoustic wave device using an identical electroacoustic transducer. This is simply due to the fact that the velocity of a shallow bulk acoustic wave is higher than that of a surface acoustic wave. Hence, in order to obtain operation of a shallow bulk acoustic wave device at the same frequency as that of a corresponding surface acoustic wave device, transducers having larger spacing between their finger pairs can be used, thus facilitating manufacture, or, for a given fingerwidth of a transducer, a shallow bulk acoustic wave can operate at a frequency higher than that of a surface acoustic wave device with the same transducer.

As shown in the diagrammatic view of FIG. 5, a grating filter utilizing the principles of the present invention comprises a transmitting electroacoustic transducer 30, a receiving electrical acoustic transducer 32 and at least two sets of reflective elements, indicated at 34 and 36, respectively. As in the delay line discussed with reference to FIG. 1, the transducers 30 and 32 are aligned on a crystal surface in such a manner that shallow bulk acoustic waves are transmitted and received relatively easily by the transducers, but the transmission of surface acoustic waves is effectively eliminated or minimized. Although the optimum configuration of the reflective elements has not yet been determined, it has been found that elements similar to those used in grating filters for SAW devices operate with reasonable efficiency in shallow bulk acoustic wave devices as well.

Each of the sets 34 and 36 of reflective elements shown in FIG. 1 comprises a plurality of parallel, equally spaced elements located at or near the surface of the crystal and oriented in a parallel relationship at approximately 45 degrees to the direction of propagation of the acoustic wave from the transmitting transducer 30. In effect, the operation of each set of reflective elements may be considered to be that of a narrow stop-band filter, in the sense that the set of elements is operative to stop, and actually reflect, acoustic energy at and near a selected frequency. Acoustic energy at frequencies outside the stop-band is transmitted through the filter in the original direction of propagation. When considered from the point of view of the reflected energy, the set of reflective elements operates as a narrow passband filter, since it reflects along a new path only the energy falling within a relatively narrow frequency band.

Each of the reflective elements in the sets 34 and 36 may take the form of either a mechanical discontinuity in the crystal, or an electrical discontinuity, or both. The detailed structure of the reflective elements is shown in FIGS. 12a-12e. The alternative forms shown therein include metalized strips 40 deposited on the surface of a crystal, indicated at 42, in FIG. 8a. In a piezoelectric crystal, an acoustic wave has associated with it an electric field, and the metalized strips 42 serve to create lines of equal electrical potential, and to reflect the wave along a new path. As indicated in the drawings, reflection from the grating is such that the angle of reflection with respect to the reflective elements is approximately equal to the angle of incidence. Thus, the reflected energy is transmitted approximately at right angles to the original direction of propagation, after which it encounters the second set 36 of reflective elements, and is similarly reflected through approximately 90 degrees, to be aligned again in parallel relationship with the original direction of propagation.

Figure 12A:
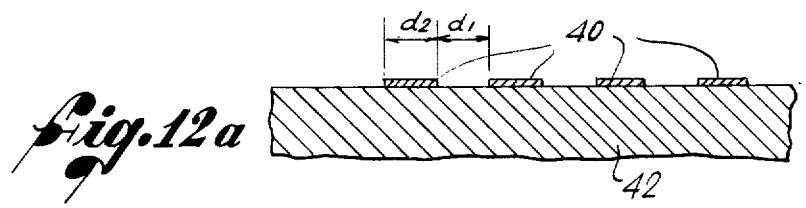
FIGS. 12a-12e are enlarged cross-sectional views of various types of construction for the reflective elements employed in devices utilizing the present invention.
Figure 12B:
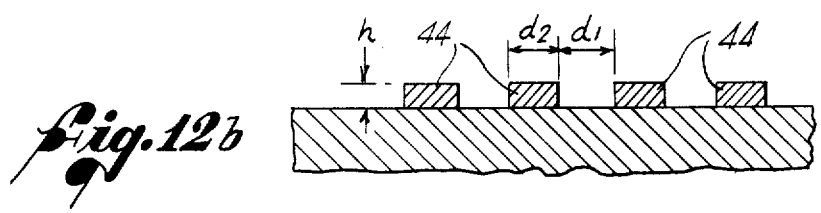
Figure 12C:
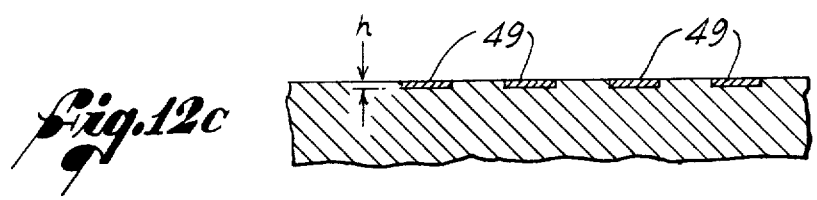
Figure 12D:
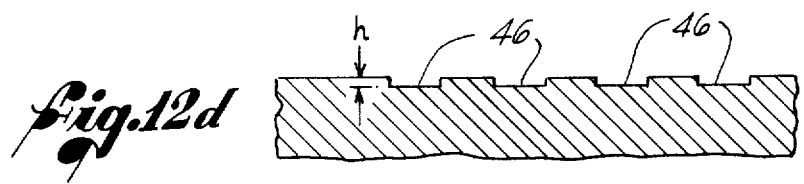
Figure 12E:
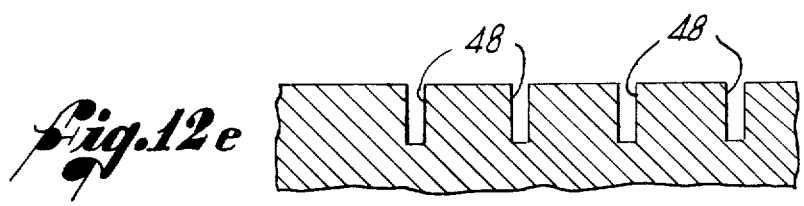

As shown in FIG. 12b, metalized strips 44 forming the reflective elements may be somewhat thicker than those shown in FIG. 12a, in which case, the elements form both an electrical discontinuity and a mechanical discontinuity, due to the larger mass of the strips. As shown in FIGS. 12d and 12e, the reflective elements may be purely mechanical discontinuities, comprising grooves 46 or deeper notches 48 in the crystal surface. In FIG. 12c there is shown yet another form of grating in which a grooved surface is metal filled, as shown at 49, again providing a combination of both electrical and mechanical discontinuity to the propagation medium of the crystal 22.

As shown in FIG. 6, another alternative grating filter configuration can be obtained by orienting a second set of reflective elements 50 at right angles to a first set 52, rather than parallel to the first, so that the reflected energy is directed back at 180 degrees from the original propagation direction, the receiving transducer 32 being appropriately positioned to receive the reflected energy. As shown in FIG. 7, a cascaded series of four such sets of grating filters, indicated at 54-57, can be used to obtain a high Q factor for the filter elements and a correspondingly high rejection response.

FIG. 8 shows a ring grating filter utilizing the same general principles. The transmitting transducer 30 and receiving transducer 32 are, as in the embodiments of FIGS. 5-7, aligned in such a direction as to obtain relatively good coupling of shallow bulk acoustic waves and substantially zero coupling of surface acoustic waves. The transducers 30 and 32, as is well known, radiate energy in two opposite directions, and are therefore only fifty percent efficient if the energy transmitted in one direction is not utilized. The transducers in this particular configuration are aligned end to end, and the remaining elements are arranged symmetrically about the two transducers. As shown in FIG. 8, there is one pair of grating filters 58 and 60 arranged to the right of the transducer, as in the FIG. 6 configuration, and a second pair 62 and 64, which is essentially the mirror image of the first pair, located to the left side of the transducers. The advantage of the ring filter is that energy transmitted from both sides of the transmitting transducer 30 is fully utilized.

FIG. 9 shows an arrangement known as a half-ring filter, wherein the two transducers 30 and 32 are arranged in the same manner as the embodiment of FIG. 8, but there is only one pair of grating filters 66 and 68 oriented at 45 degrees to the first propagation direction, in the path from the sending transducer to the receiving transducer, shown in FIG. 9 as located to the right of the transducers. To the left of the transducers 30 and 32 are two other grating filters 69 and 70 arranged in an essentially parallel relationship with the finers of the transducers. Energy propagated from the transmitting transducer 30 in the left-hand direction is reflected back through the transducer, which then functions essentially as a unidirectional device.

The interdigital transducers 30 and 32 used in the aforedescribed reflective devices are of the same general type as is shown by way of example in FIG. 11. Each transducer comprises a pair of parallel spaced-apart pads 71, known as sum bars, and two sets of fingers 72 extending out from the sum bars towards each other in an interleaving fashion, like the teeth of two combs. Although only two pairs of fingers are shown, many more pairs may, in fact, be used, depending primarily upon the desired frequency response of the transducer. In general, more fingers yield a sharper resonant frequency, and a transducer with few fingers has a relatively wideband frequency response.

The number of elements in each grating filter is largely a matter of design choice. Generally, a greater number of elements gives better reflection characteristics, but there appears to be no significant advantage in a filter having more than about 200 elements. The elements can be weighted by varying their length, to obtain better rejection of side lobes in the frequency response. The width and spacing dimensions of the elements are also a matter of design choice. By way of example, for a 35.1° rotated y-cut crystal of lithium tantalate ($LiTaO_3$), and for propagation in the x direction, an element width of 5 microns ($5 \times 10^{-6}$ meter) and a gap of 5 microns, measured normal to the grating, yields a frequency of operation of approximately 240 MHz.

The embodiment shown in FIG. 10 also comprises a sending transducer 76, a receiving transducer 78 and two sets of reflective elements 80 and 82 arranged at approximately 45 degrees to the first propagation direction. However, the reflective elements of the sets 80 and 82 are spaced apart non-uniformly, with the elements first encountered by the acoustic wave from the transmitting transducer being spaced closer together than the reflective elements later encountered by the same acoustic wave. Accordingly, the first-encountered reflective elements will strongly reflect energy at a relatively high frequency, while the last-encounted elements will reflect energy at a lower frequency. There is, therefore, a separation of the frequency components of the acoustic wave, the separated components being transmitted, as shown by the arrows 84, to the second set of reflective elements 82, which are also spaced in the same non-uniform manner as the first set. The separated frequency components are then reflected by the second set of reflective elements back along a common path toward the receiving transducer 78. It will be apparent that, in the embodiment shown, frequency components having a lower frequency will be transmitted over a longer path than those of a higher frequency, and consequently will arrive at the receiving transducer later than the higher frequency components.

By way of example, for a 35.1° rotated y-cut $LiTaO_3$ crystal, with propagation in the x direction, if 5 micron-wide elements are spaced between 5 microns apart and 7.26 microns apart, measured across the gaps in a direction normal to the grating, the device provides a bandwidth of 120 MHz to 240 MHz.

The device shown by way of example in FIG. 10 has application whenever the frequency components of a signal must be expanded or compressed with respect to time. Such pulse compression or expansion techniques find application in radar systems in which each radar pulse is a frequency-modulated signal of which the frequency is linearly swept from a high to a low value during the duration of the pulse. It will be apparent that, if such a linear-frequency-modulated signal, sometimes known as a chirp signal, were to be applied as in input to the inverse of the device shown in FIG. 10, i.e., one in which the higher frequencies were delayed more than the lower frequencies, then compression of the chirp pulse would result.

As mentioned earlier, a problem of particular concern in acoustic wave devices is that the characteristics of the devices, and particularly the velocity, change with temperature. In accordance with another aspect of the present invention, this variation of wave velocity with temperature can be minimized by directing the propagated wave through a portion of piezoelectric material in a preselected direction, such that the material has a favorable or a compensating effect on the temperature characteristics of the device.

For example, in the grating filter configurations shown in FIGS. 5 and 6, the reflective elements can be spaced such that the path between the reflective elements is longer and has more effect, as to temperature-related variations, than the path portions between the transducers and the reflective elements. Moreover, the crystal material can be such that, although the temperature stability characteristics with respect to the original direction of propagation are not good, the temperature stability characteristics with respect to the reflected direction of propagation are relatively good. Consequently, the overall temperature stability characteristics can be improved by reflecting the acoustic wave to a path direction having good temperature stability characteristics.

Figure 13:
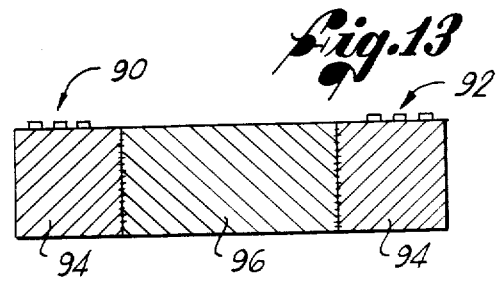
FIG. 13 is a simplified sectional view of one embodiment of the invention as used for temperature compensation.
Figure 14:
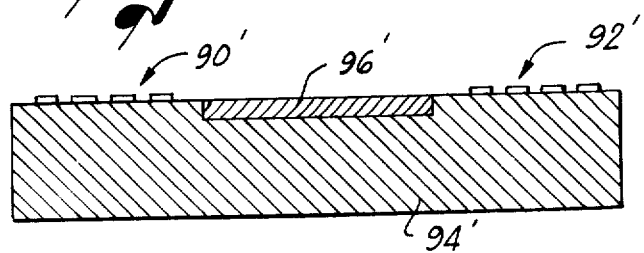
FIG. 14 is a simplified sectional view of another embodiment of the invention as used for temperature compensation.

In another technique, shown in FIGS. 13 and 14, the transmission path between transducers 90 and 92 includes two different materials, a first substrate 94 on which the transducers are located, and a second substrate material 96 located between the two portions 94 and bonded thereto to form a single composite substrate. The material 94 under the transducers is, of course, selected to have good coupling properties, while the material 96 is selected to have good temperature stability characteristics.

In the embodiment shown in FIG. 14, a sending transducer 90' and a receiving transducer 92' are located on a primary substrate 94', and an intermediate material 96' is embedded in the primary substrate to form an intermediate propagation medium of good temperature stability characteristics. Although both these techniques have been employed in corresponding surface acoustic wave devices, the boundaries between the different substrate materials usually have an adverse effect on the propagation of surface acoustic waves. In contrast, the interfaces between the substrate materials in shallow bulk wave devices have only a minimal effect on the propagation of shallow bulk waves.

Figure 15:
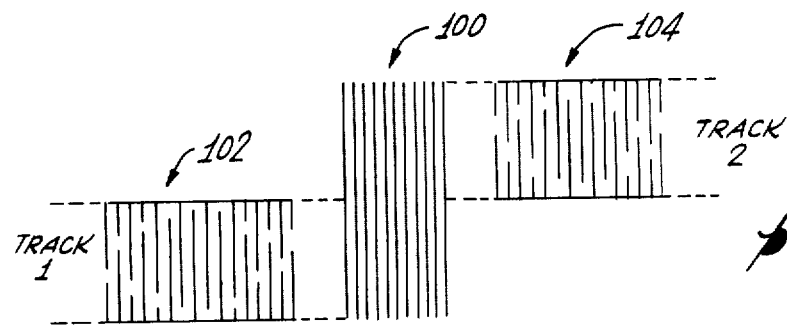
FIG. 15 is a simplified plan view of a pair of weighted interdigital transducers and a multistrip coupler utilizing shallow bulk acoustic waves.

In another embodiment of the invention, the transmission path between sending and receiving transducers includes a coupling device for electrically tracking the energy of the shallow bulk waves from one transmission path to another. As shown in FIG. 15, a multistrip coupler 100 is interposed between a sending transducer 102 and a receiving transducer 104 in a shallow bulk acoustic wave filter device. It will be seen that the shallow bulk acoustic wave propagated from the sending transducer 102 is aligned with one portion of the multistrip coupler 100, and the receiving transducer 104 is aligned with another portion of the coupler. The coupler 100 comprises a plurality of metalized strips extending across the surface of the crystal perpendicular to the direction of propagation. When the number of strips is optimally selected, practically all of the energy received at the coupler is coupled in electrical form along the strips and propagated from the other portion of the coupler as shown by the arrow 106. The wave retransmitted from the coupler 100 is identical in form to the originally propagated wave, but is shifted in phase by 90° as a result of the operation of the coupler. The coupled wave is received by the receiving transducer 104. The principle advantage of using a multistrip coupler such as this in a filter device is that both the sending and receiving transducer 102 and 104 may be of the weighted type and, as shown in the drawings, may be weighted by apodization.

The center-to-center spacing between the strips of a coupler is typically equal to or greater than one wavelength, to provide essentially zero reflection and a broadband coupling action. For example, in a device operating at 200 MHz and utilizing 35.1° rotated y-cut lithium tantalate (LiTaO$_3$), a gap width and strip width of 3.82 microns (micrometers) would be appropriate.

Figure 16:
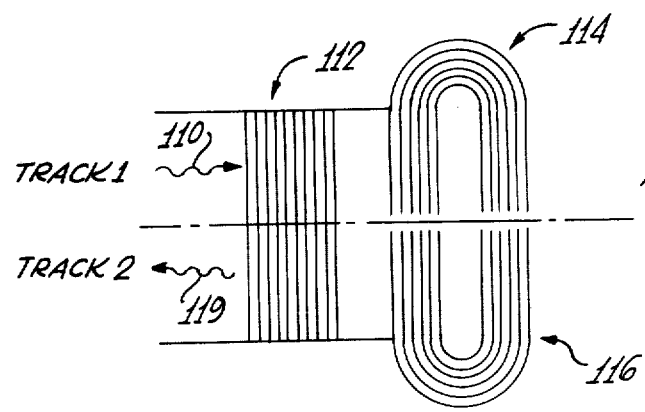
FIG. 16 is a simplified plan view of a shallow bulk acoustic wave track changer utilizing multistrip couplers.
Figure 17:
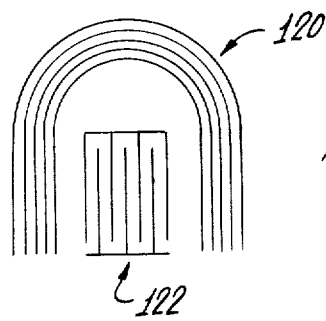
FIG. 17 is a simplified plan view of a unidirectional transducer utilizing a multistrip coupler.

Transmission paths or tracks may be changed for purposes of increasing the effective path length of a delay line, much as shown in FIG. 16. It will be seen that a shallow bulk wave propagated along a first track, indicated by the arrow 110, is incident upon a multistrip coupler 112 similar to the coupler 100 in FIG. 15. The coupler 112 is designed, in accordance with design principles established for SAW couplers, such that half of the incident energy is coupled down to the lower half of the coupler 112, and half is transmitted through in the original direction of propagation. Situated to the right of the coupler 112 is a pair of U-shaped couplers 114 and 116, an inverted U-shaped coupler 114 aligned to receive energy transmitted through the coupler 112 along the first track, and a second, non-inverted, U-shaped coupler 116 aligned with a second track and with the lower half of coupler 112.

Both of the U-shaped couplers act as perfect reflectors of energy, since each is designed to couple half of the incident energy and allow the other half to pass through, and since each coupled wave undergoes a 90° phase shift. The reflection function of a U-shaped coupler is well known in SAW technology, and can best be understood as follows:

A wave incident from the left on one leg of the U splits into two portions, one portion (a) transmitted through to the second leg and one portion (b) coupled to the second leg around the U. The transmitted portion (a) is again split at the second leg into a further transmitted portion (c) and a portion (d) coupled back to the first leg. This latter portion (d) coupled back to the first leg is retransmitted therefrom back toward the left. The portion (b) coupled from the first to the second leg is also retransmitted to the left, where it encounters the first leg again and is split into a transmitted portion (e) and a coupled portion (f), which is transmitted to the right from the second leg. Further analysis shows that portion (f) has undergone two 90° phase shifts due to coupling, whereas portion (c) has undergone none. Consequently, portions (c) and (f) cancel, but portions (d) and (e) are in phase. Accordingly, all of the incident energy is reflected to the left.

It follows by a similar analysis that energy incident on the coupler 112 along "track 1", as indicated by the arrow 118, will be totally reflected along "track 2", as indicated by the arrow 119. A wave transmitted through coupler 112, reflected by U-shaped coupler 114 and transmitted back through coupler 112 again will be cancelled by a component coupled to track 2, reflected by coupler 116 and coupled to track 1 again. Such a device as this has application in delay lines in which a relatively long path length can be provided without a correspondingly long crystal.

Finally, in another application of a coupler, a U-shaped multistrip coupler 120 is located with a interdigital transducer 122 between its parallel legs. By spacing the transducer 122 with respect to the coupler 120, such that the transducer is closer to one leg of the coupler than the other, by a distance of one quarter-wavelength, transmission of acoustic energy from the transducer is rendered essentially unidirectional. Energy transmitted toward the closer leg will have one component transmitted through the coupler and one component coupled to the other leg. Similarly, energy transmitted toward the more distant leg will have one component transmitted through and one component coupled back to the closer leg. However, this latter coupled component is subjected to a 90° phase lag because of the extra distance it traverses, and a further 90° phase lag due to coupling. Consequently, it is 180° out of phase with the component transmitted directly through the closer leg, and no energy emerges from the closer, or left-hand side of the coupler. On the other hand, both components directed out of the right-hand side of the coupler are in phase.

It will be apparent from the foregoing that the present invention represents a significant advance in the field of acoustic wave devices. In particular, it provides an improved family of such devices, including delay lines, filters, reflective devices, couplers, and oscillators, all having superior characteristics to the corresponding devices implemented utilizing surface wave technology. It will also be appreciated that, although specific embodiments of the invention have been described for purposes of illustration, various changes may be made without departing from the spirit and scope of the invention. Accordingly, the invention is not to be limited except as by the appended claims.

We claim:

1. A shallow bulk acoustic wave device comprising: a block of anisotropic piezoelectric material having a surface, having physical properties which may be defined by reference to a set of orthogonal crystallographic axes, and being capable of propagating surface acoustic waves and shallow bulk acoustic waves; and
a pair of electroacoustic transducers disposed on said surface and so oriented with respect to said crystallographic axes that the electromechanical coupling coefficient for surface acoustic waves is substantially zero while the electromechanical coupling coefficient for shallow bulk acoustic waves is relatively large, whereby when an electric signal is applied to one of said transducers, a shallow bulk acoustic wave is launched in said block and propagated toward the other of said transducers, said other transducer serving to transform the shallow bulk acoustic wave into an output electric signal.

2. A device as recited in claim 1, wherein said material comprises rotated y-cut quartz.

3. A device as recited in claim 1, wherein said material comprises ST-cut quartz.

4. A device as defined in claim 1, wherein said transducers are disposed to launch a shallow bulk acoustic wave in a direction substantialy normal to the most desirable direction of propagation of a surface acoustic wave in the same piezoelectric material.

5. A device as defined in claim 1, wherein said material comprises double rotated quartz.

6. A device as defined in claim 1, and further including an external signal amplifier, and wherein the electrical signal applied to one of said transducers is derived from said amplifier, and the input signal to said amplifier is derived from said other transducer, whereby said device forms a feedback path for an oscillator circuit.

7. A shallow bulk acoustic wave device comprising:
a block of anisotropic piezoelectric material having physical properties which may be defined by reference to a set of orthogonal crystallograhic axes, having a generally planar surface, and being capable of propagating surface acoustic waves and shallow bulk acoustic waves; and
first and second electroacoustic transducers disposed on said surface and being arranged in a predetermined configuration with respect to said crystallographic axes such that the electromechanical coupling coefficient for surface acoustic waves is negligibly small, said material serving to launch a shear wave in said block when an electric signal is applied to said first transducer, said shear wave propagating toward said second transducer as a shallow bulk acoustic wave, and said second transducer serving to transform said shallow bulk acoustic wave into an electric signal.

8. A shallow bulk acoustic wave device comprising:
a pair of electroacoustic transducers;
means defining a path between said transducers for the transmission of shallow bulk acoustic waves, said means including a block of anisotropic piezoelectric crystalline material having a surface into which both surface acoustic waves and shallow bulk waves can be propagated, and said transducers being so oriented on said surface that the electromechanical coupling coefficient is practically zero for surface waves but is substantial for shallow bulk waves.

9. A shallow bulk acoustic wave device as set forth in claim 8, wherein said means defining a path between said transducers further includes coupling means for transmitting at least of portion of the energy associated with the shallow bulk acoustic waves from a first direction of propagation to a second direction of propagation.

10. A shallow bulk acoustic wave device comprising:
a block of anisotropic piezoelectric material having physical properties that may be defined by reference to a set of crystallographic axes and having a surface into which both surface acoustic waves and shallow bulk acoustic waves may be propagated;
a sending interdigital transducer and a receiving interdigital transducer disposed on said surface and so oriented with respect to said crystallographic axes that coupling of surface acoustic waves is minimized and coupling of shallow bulk acoustic waves is substantial; and
a multistrip coupler disposed on said surface and having a portion of its width aligned with a first propagation path from said sending transducer and another portion of its width aligned with a second propagation path to said receiving transducer, whereby energy is coupled from said first propagation path to said second propagation path.

11. A shallow bulk acoustic wave device as set forth in claim 10, wherein:
said transducers both have a weighted frequency characteristic;
said coupler comprises a plurality of straight, parallel metallized strips having part of their length normal to said first propagation path and another part of their length normal to said second propagation path, wherein substantially all of the energy received over said first propagation path is coupled to said second propagation path.

12. A shallow bulk acoustic wave device as set forth in claim 10, wherein:
said second propagation path is parallel to and opposite in direction to said first propagation path;
said coupler includes
a set of parallel straight metallized strips having a first portion aligned with said first path and a second portion aligned with said second propagation path, wherein approximately half of the energy incident on said set of strips is coupled, and two sets of U-shaped metallized strips which act as reflectors;

whereby wave components are of such a phase relationship after coupling that there is self-cancellation of components back along said first propagation direction, and all of the energy is transmitted along said second propagation direction.

13. A unidirectional transducer for a shallow bulk acoustic wave device, comprising:

an interdigital transducer located on the surface of a block of anisotropic piezoelectric material at such an orientation that there is essentially no coupling of surface acoustic waves and substantial coupling of shallow bulk acoustic waves;

a U-shaped multistrip coupler disposed on said surface and having two parallel legs located one on each side of said interdigital transducer, with one of said legs being closer to said transducer by one-quarter wavelength of the shallow bulk waves transmitted by said transducer, whereby energy components are self-cancelling in one direction from said transducer, but are additive in the other direction.

14. A temperature-compensated shallow bulk acoustic wave device comprising:

a block of anisotropic piezoelectric material having physical properties which may be defined by reference to a set of crystallographic axes and having a surface into which both surface acoustic waves and shallow bulk acoustic waves may be propagated;

a pair of electroacoustic transducers disposed on said surface and so oriented with respect to said crystallographic axes that coupling of surface acoustic waves is minimized and coupling of shallow bulk waves is substantial; and temperature compensation means situated between said transducers, wherein said temperature compensation means includes a portion of a second piezoelectric material interposed in the path of the shallow bulk acoustic waves and having a temperature coefficient of velocity change less than or opposite to that of said block of piezoelectric material, whereby the overall temperature coefficient of velocity change is substantially reduced.

15. A device as set forth in claim 14, wherein:

said block of piezoelectric material is comprised of two separate sections; and said portion of a second piezoelectric material is located between said two sections and is bonded thereto.

16. A device as set forth in claim 14, wherein said portion of a second piezoelectric material is formed as a thin layer embedded in said surface between said transducers.

17. A shallow bulk acoustic wave device comprising:
a pair of electroacoustic transducers; and
means defining a path between said transducers for the transmission of shallow bulk acoustic waves, said means including a block of anisotropic piezoelectric crystalline material having a surface into which both surface acoustic waves and shallow bulk waves can be propagated, and said transducers being so oriented on said surface that the electromechanical coupling coefficient is practically zero for surface waves but is substantial for shallow bulk waves;

and wherein said means defining a path between said transducers further includes at least one set of reflective elements located on said surface and so oriented with respect to the direction of propagation of the wave that the direction of propagation of selected frequency components is changed between said transducers.

18. A shallow bulk acoustic wave device as set forth in claim 17, wherein said reflective elements are uniformly spaced to provide reflection of acoustic energy within a relatively narrow band of frequencies.

19. A shallow bulk acoustic wave device as set forth in claim 17, wherein said reflective elements are nonuniformly spaced to provide different path lengths for different frequencies and therefore provide frequency compression or expansion.

20. A shallow bulk acoustic wave device comprising:
a pair of electroacoustic transducers; and
means defining a path between said transducers for the transmission of shallow bulk acoustic waves, said means including a block of anisotropic piezoelectric crystalline material having a surface into which both surface acoustic waves and shallow bulk waves can be propagated, and said transducers being so oriented on said surface that the electromechanical coupling coefficient is practically zero for surface waves but is substantial for shallow bulk waves;

and wherein said means defining a path between said transducers further includes means for compensating for the effects of temperature on said device.

21. A shallow bulk acoustic wave device as set forth in claim 20, wherein said means for compensating for the effects of temperature includes two sets of reflective elements to reflect acoustic energy to a direction having associated with it a more favorable temperature coefficient of velocity change.

22. A shallow bulk acoustic wave device as set forth in claim 20, wherein said means for compensating for the effects of temperature includes a portion of a second piezoelectric material located intermediate said transducers, and having a more favorable or compensating temperature coefficient of velocity change as compared with that of said block of piezoelectric material.

23. A shallow bulk acoustic wave device comprising:
a block of anisotropic piezoelectric material having crystallographic axes and having a surface into which surface acoustic waves and shallow bulk acoustic waves may be propagated;

a sending electroacoustic transducer and a receiving electroacoustic transducer disposed on said surface and so oriented with respect to the crystallographic axes that the electromechanical coupling coefficient is essentially zero for surface acoustic waves and is relatively large for shallow bulk acoustic waves, whereby shallow bulk acoustic waves can be launched into said piezoelectric material in a first propagation direction from said sending transducer;

a first set of reflective elements located at the surface of said piezoelectric material and inclined at an angle to said first propagation direction, said reflective elements being operative to change the direction of propagation of predetermined frequency components of the shallow bulk acoustic waves; and a second set of reflective elements, operative to reflect predetermined frequency components of the reflected shallow bulk acoustic wave into a direction parallel with said first propagation direction, to be received by said receiving transducer; and wherein said reflective elements are spaced nonuniformly to reflect different selected frequency components at different portions of said sets of reflective elements, whereby components at some frequencies traverse a longer path than components at other frequencies, and the times of occurrence of the various frequency components are compressed or expanded with respect to time.

24. A shallow bulk acoustic wave device as set forth in claim 23, wherein:
the spacing between said reflective elements increases linearly from one side of said set of elements to the other side.

* * * * *